United States Patent [19]

Rogers et al.

[11] Patent Number: 4,681,652

[45] Date of Patent: Jul. 21, 1987

[54] MANUFACTURE OF POLYCRYSTALLINE SILICON

[76] Inventors: Leo C. Rogers, 1651 W. Lindner, Mesa, Ariz. 85202; Alfred J. Heitz, 2950 E. Dover, Mesa, Ariz. 85203

[21] Appl. No.: 156,659

[22] Filed: Jun. 5, 1980

[51] Int. Cl.$^4$ ............................................... C30B 25/10
[52] U.S. Cl. ........................... 156/613; 156/DIG. 73; 427/95
[58] Field of Search ....... 156/613, DIG. 64, DIG. 89, 156/DIG. 73; 148/175, 174; 423/324, 348, 349, 350; 427/86, 95, 248, 255, 255.1; 118/725; 422/245

[56] References Cited

U.S. PATENT DOCUMENTS

| | | | |
|---|---|---|---|
| 3,147,141 | 9/1964 | Ishizuka | 156/613 |
| 3,328,199 | 6/1967 | Sirtl | 156/613 |
| 3,594,227 | 7/1971 | Oswald | 148/175 |
| 3,911,194 | 10/1975 | Dejachy et al. | 156/613 |
| 4,150,168 | 4/1979 | Yatsurugi et al. | 423/350 |
| 4,155,781 | 5/1979 | Diepers | 148/175 |

FOREIGN PATENT DOCUMENTS

| | | | |
|---|---|---|---|
| 1212948 | 3/1966 | Fed. Rep. of Germany | 423/348 |
| 2743856 | 4/1979 | Fed. Rep. of Germany | 156/613 |

Primary Examiner—Hiram H. Bernstein

[57] ABSTRACT

Process of growing polysilicon on a plurality of deposition members grouped in a double ring, i.e., an outer circle surrounding an inner circle of members.

7 Claims, 10 Drawing Figures

MANUFACTURE OF POLYCRYSTALLINE SILICON

BACKGROUND OF THE INVENTION

This invention relates to the manufacture of polycrystalline silicon and more particularly to the growth of semiconductor grade polycrystalline silicon.

In the manufacture of silicon for the semiconductor industry, polycrystalline silicon is referred to as polysilicon and this latter term will be generally used herein. Polysilicon for the semiconductor industry is most generally produced by a thermal decomposition and deposition process wherein a silicon-containing composition, generally a silane, is reduced to effect deposition of polysilicon on a wire or rod. Such a polysilicon process, (or "poly" process) while of a general epitaxial nature, is to be distinguished from the semiconductor industry "epitaxial" or "epi" process wherein a silane, typically silicon tetrachloride ($SiCl_4$) is decomposed and deposited to produce a monocrystalline layer of silicon on a monocrystalline wafer or substrate. To an extent, a polysilicon process will produce some monocrystalline silicon in the ingots but that is not the intent since the ingots are to be melted and pulled or zoned into monocrystalline silicon in a crystal puller or zoner.

In pulling monocrystalline silicon by the Czochralski method, pieces of polysilicon are placed in a crucible within a crystal pulling apparatus and melted. A monocrystalline piece (a seed) of silicon is then brought into contact with the surface of the melt so that material from the melt is caused to solidify on the seed. As the seed is raised away from the melt, material continues to "grow" thereon and a monocrystalline silicon rod thereby produced. In the zoning method of producing monocrystalline silicon, an ingot of polysilicon is mounted within the zoning apparatus. A seed is contacted to an end of the ingot and localized heat is used to melt the end of the ingot and the end of the seed. As material from the ingot solidifies on the seed, the source of localized heat and hence the molten zone is moved along the ingot leaving monocrystalline silicon where the molten zone had been. By analogy to the Czochralski method, the ingot of polysilicon ma be considered as the crucible and material used in the former method.

Polysilicon for the Czochralski method has been generally produced by deposition on a wire or a rod; typical material is tungsten or tantallium wire or silicon rod. This conductive member, if not silicon, is removed from the polysilicon ingot, as by drilling, prior to placement of the silicon in the puller crucible. (For zoning purposes, the polysilicon is often grown on starting rods of polycrystalline silicon, called slimrods, to distinguish them from the finished rods or ingots of monocrystalline silicon produced by the Czochralski or zoning methods. The slimrods of silicon need no be removed from the ingot prior to placement in the zoner.) When growing polysilicon, the starting deposition member is mounted in ambient controllable apparatus, such as bell jar reactor apparatus, with electrical connections made to the ends of the member so that it may be heated by an electric current. In most cases, the apparatus is single-ended, i.e., the feed-throughs for the electrical connections are through the base on which the bell jar is mounted. Thus, while in its simplest form the equipment may utilize but a single wire or rod, it is customary to use pairs of members connected in a "hairpin" or inverted "U" arrangement. Thus the lower end of each member of the pair is connected to an electrical source and electrical continuity completed by electrical connections between the top ends of the members.

The methods herein described for multirods also apply to the growth of monocrystal silicon on slimrods as well as polycrystal silicon on slimrods and the descriptions are equally applicable for both cases.

Further, pairs of deposition members have been included in the reactor for reasons of economy and productivity. Thus, arrangements of four to ten members have been used. The placement of the rods must be to provide adequate gas inlet for each rod, as well as provision for removal of unused and by-product gases. The rods must be spaced from each other and from the bell jar to allow for the ultimate diameter size of the ingot being grown. Within these criteria, a two pair arrangement has the members on the corners of a square, a three pair arrangement on the points of a hexagon, and a four pair arrangement on the points of an octagon, etc., for as many rods as can be accommodated. Thus, essentially all arrangements are a single ring or circle which allows sufficient spacing between the rods to allow the rods to grow to full diameter during the process.

The normal system for maintaining the rods at silicon deposition temperatures involves connecting them electrically in series or parallel to maintain uniform rod temperatures, and hence, relatively uniform growth. When the number of rods is more than four and the typical diameter to be grown is up to nine inches, much of the heat radiated from the rods is lost from the process, particularly when the rods are yet small. As the rods grow in diameter, the cross radiation from rod to rod becomes more effective as utilizing this heat within the system, particularly that heat which is radiated inside the ring of rods to the other rods. At the start of deposition and until the end is reached, there is a relatively low heat utilization, thus the reason for the large quantities of energy required to produce the silicon.

SUMMARY OF THE INVENTION

It is an object of this invention to provide a more energy efficient and mor economic process for producing polysilicon.

A further object of the invention is to provide novel process for producing multiple rods of polysilicon simultaneously.

A still further object of the invention is to provide a novel process for producing multiple rods of polysilicon simultaneously.

A still further object of the invention is to provide a process of producing polysilicon by utilization of a double ring association of multiple deposition members.

In accordance with these objects, there is a process for producing silicon which utilizes an arrangement of deposition members in double ring whereby the members of the inner ring radiate heat to the members of the outer ring and the members of the outer ring radiate heat to the members of the inner ring.

THE DRAWINGS

A further understanding of the invention and the objects and advantages thereof will be understood from the following complete description thereof and from the drawings wherein.

COMPLETE DESCRIPTION OF THE INVENTION

Silicon semiconductors are produced in or from wafers of monocrystalline silicon. These wafers are made by a saw and polish process from large ingots or rods of monocrystalline silicon produced by the Czochralski method or the float zone method from polysilicon rods. This invention relates to the production polycrystalline silicon or monocrystalline silicon by a thermal decomposition and deposition method in a manner which increases productivity while being conservative of the energy utilized.

Figure 1:
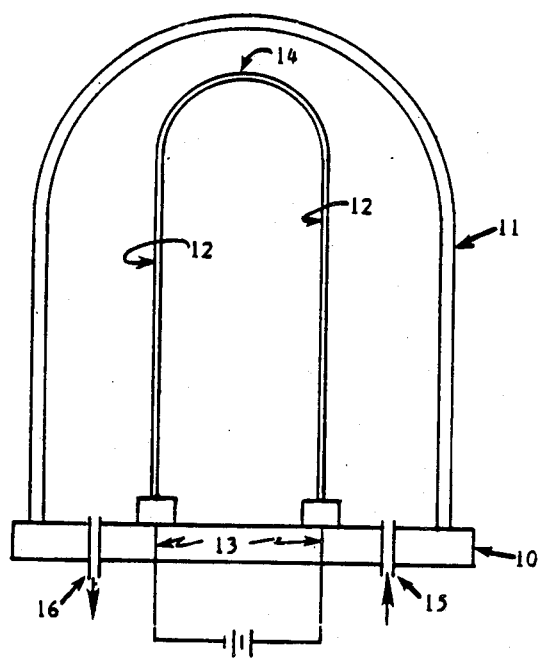
FIG. 1 is a schematic vertical section of a polysilicon deposition reactor.
Figure 2:
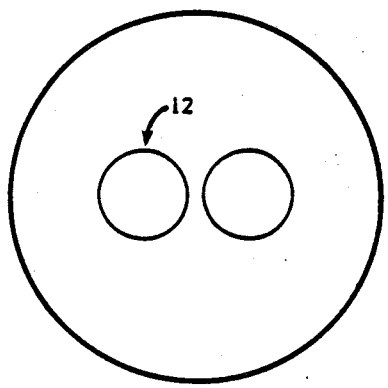
FIGS. 2-5 are horizontal sections of the reactor depicting prior art arrangements of deposition members.

Referring to FIG. 1, a reactor (shown schematically) for the production of polysilicon includes a base 10 and a bell jar 11. While in its simplest form the system need be but a single deposition member or rod 12, it is customary to utilize at least a pair of rods 12 as shown in FIGS. 1 and 2. This pairing arrangement permits the connection of the lower ends of the rods to feedthroughs 13 and the upper ends to be electrically connected by a conductor 14 in a "hairpin" manner. In the instance of a tungsten or tantalum wire deposition member, the pair of rods 12 and the conductor 14 may be a single piece of wire with an inverted "U" shape. It will be understood that the invention is applicable to double-ended variety of reactor as well, i.e., a reactor wherein the electrical feedthrough can be provided at both ends of the deposition rods.

In operation, the deposition rods 12 are mounted on the base 10 as shown and the bell jar 11 is lowered to close the reactor chamber. The reactor is then evacuated or purged and then filled with a carrier and silane type gas through inlet/outlet conduits 15 and 16. Electric current through the deposition rods heats the rods to a temperature, approximately 1100° C., at which time the decomposition and deposition from the silicon containing gas takes place. Flow of the gas such as silicon tetrachloride, trichlorosilane, dichlorosilane, or mixtures thereof and a carrier gas through the reactor then causes growth of the polysilicon. Current through the rods is maintained a equal uniform condition in each rod to maintain relatively uniform deposition and growth on each rod. When the polysilicon rods have grown to the desired diameter size, flow of current and gas is terminated and the reactor returned to ambient conditions for opening and removal of the polysilicon rods.

Figure 3:
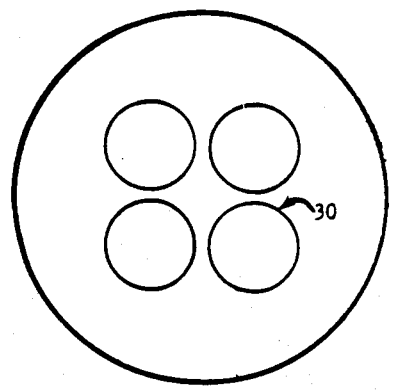
Figure 4:
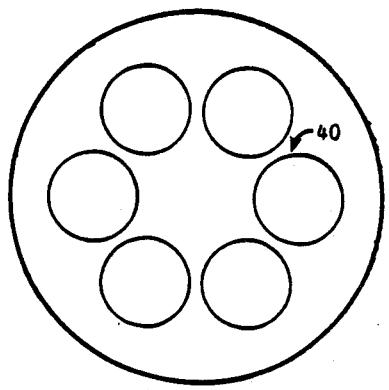
Figure 5:
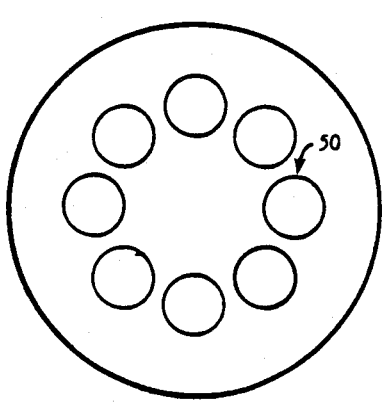

For reasons of economy and productivity, further pairs of deposition members have been mounted in the reactor chamber simultaneously. Thus, FIG. 3 depicts a grouping of two pairs of rods 30 arranged at the corners of a square. When three pairs of rods 40 (FIG. 4) or four pairs of rods 50 (FIG. 5) have been used, the rods have been arranged on the points of a hexagon or the points of an octagon, respectively. Thus, all of the prior art arrangements are a single ring or circle which allows sufficient spacing between the rods to allow the rods to grow to the full diameter desired.

When the number of rods is greater than four and the typical diameter of deposition is up to nine inches, the heat is:

(1) radiated by the outside of the rods to the lower temperature bell jar and reradiated or conducted by the bell to the lower temperature ambient;

(2) conducted by heated gas to the lower temperature bell jar and radiated or conducted by the bell to the lower temperature ambient;

(3) convected to the upper portion of the bell jar and radiated or conducted by the bell jar to the lower temperature ambient;

(4) absorbed by the gases which enter the reactor at a low temperature and leave at an elevated temperature; and (5) radiated to the bell, reflected by the bell and reabsorbed by the rods.

The heat radiated by the rods to the inside of the circle is:

(1) radiated by the inside of the rods and passes between the other rods forming the remainder of the circle and to the lower temperature bell jar and reradiated or conducted by the bell to the lower temperature ambient;

(2) conducted by heated gas to the lower temperature bell jar and radiated or conducted by the bell to the lower temperature ambient;

(3) convected to the upper portion of the bell jar and radiated or conducted by the bell jar to the lower temperature ambient;

(4) absorbed by the gases which enter the reactor at a low temperature and leave at an elevated temperature; and (5) radiated to the inside of other rods for partial absorption by other rods forming the remainder of the circumference. When silicon deposition occurs on either the silicon slimrod or wire deposition members from a silicon-containing composition of silicon tetrachloride dichlorosiliane, trichlorosilane, silane and mixtures thereof in a carrier gas, radiation absorbed by other rods forming the remainder of the circumference is small, particularly at the beginning of the deposition cycle. For example, the spacing between slimrods (polyenyptalline silicon rods with a 0.25 in. diameter) is about ten inches if the polysilicon rods are to be grown to a diameter size of nine inches and there are four rods. Thus, the initial slimrods occupy about two percent of the periphery (circumference) of the ring formed by the rods within the reactor chamber. If wire deposition members are used, the rods would occupy even less space since customarily wires are smaller than silicon slimrods. As the rods grow in diameter, inner circle cross radiation becomes more effective. Unfortunately, when the rods reach full size and now occupy about 91% of the circumference about the ring so that radiation losses from the inner surface of the rods would be minimized, deposition is stopped before gas flow problems initiate improper growth. This limitation becomes most costly as the number of rods in the ring is increased for larg scale production. Thus, for the same example above given, i.e., a 0.25 inch rod with 10 inch spacing to grow a 9 inch rod, a single pair of deposition rods would have a "ring" diameter of ten inches. A five-pair circle of ten deposition rods has a diameter of approximately thirty-two inches. Again the inner circle cross radiation effectiveness improves as the rods grow but at the beginning and for the majority of the growth period, it is minimal. In the case of four rods there are four separations between rods at the end of growth but for ten rods there are ten spaces between rods at the end of growth. Thus, the improved effectiveness of cross radiation with growth is more limited for large scale production.

Figure 6:
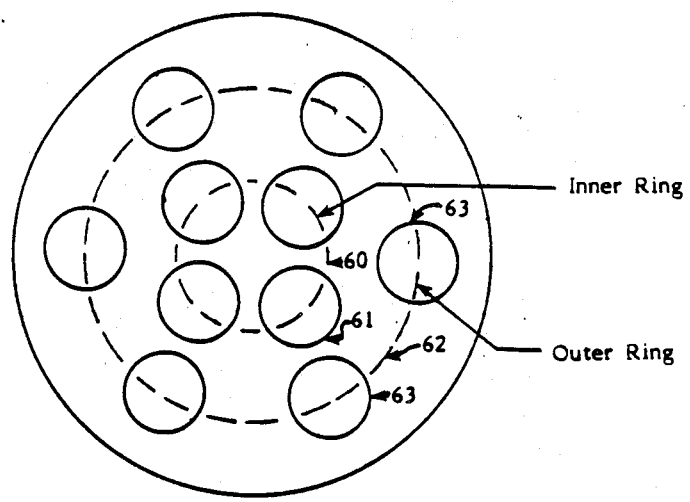
FIGS. 6-10 are horizontal sections of the reactor with deposition rods associated in accordance with the invention.

In accordance with this invention, a double ring of deposition members is provided as shown in FIG. 6-10. Referring to FIG. 6, there is provided within the reactor chamber an inner ring 60 of four deposition rods 61 and an outer ring 62 of six deposition rods 63. Thus, there is an increase of proximity radiation because the distance between rods is reduced, as well as an improvement in utilization of inner circle radiation and outer circle radiation. Outer circle radiation of the rods 63 of the ring 62 to the outside bell jar is relatively unchanged fro the prior art and the losses occur as pointed out hereinbefore. However, now the inner circle radiation of rods 63 is available to be absorbed by rods 61 of inner ring 60. Also, both the outer circle radiation and the inner circle radiation of rods 61 of inner ring 60 is available to be absorbed by the rods 63. There is also an improvement in the re-absorption of radiation reflected and scattered from the bell jar since an increased percentage of the area of the ring 62 is filled with deposition rods, i.e., the area now includes rods 61 as well as rods 63.

Thus, it will be seen that radiation from the inside of the rods of the outer ring strikes the outside of the inner ring as well a striking the inside of the remainder of rods in the oute ring of rods. Because the inside circle of rods is in close proximity to the outside circle of rods, the radiation heating effects become considerably more pronounced as compared to the previous longer paths where gas cooling and conduction losses had more opportunity to decrease the heat transfer to other rods. Also the outside of the inner circle of rods heats the inside of the outer circle of rods while the inside of the outer circle of rods heats the outside of the inner circle of rods, and the inside of the inner circle of rods heats the inside of the inner circle of rods and the inside of the outer circle of rods.

This cross heating requires less power to maintain the totality of rods at the deposition temperature, thus giving a power savings of up to 40% per kilogram of polysilicon.

Figure 7:
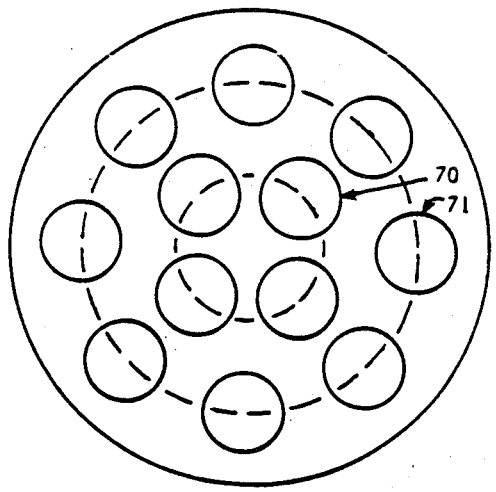
Figure 8:
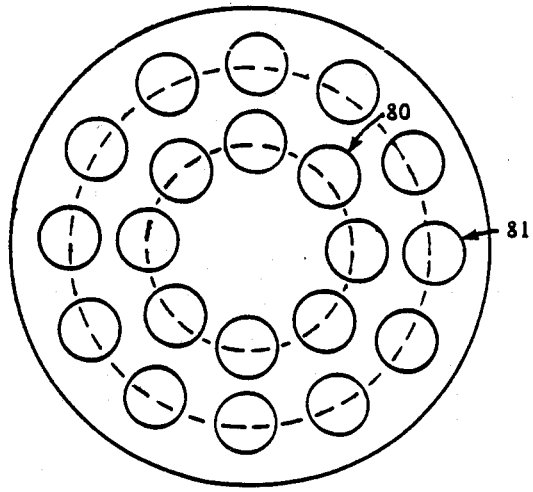
Figure 9:
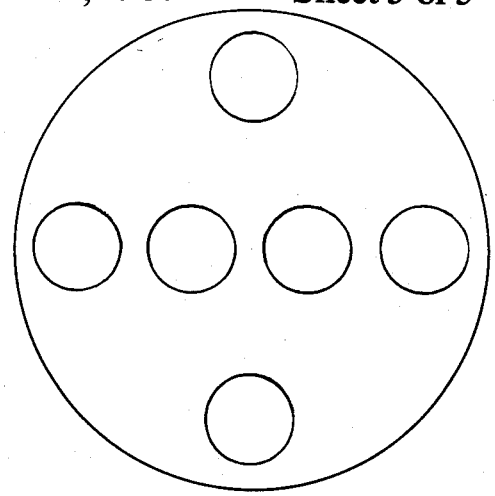
Figure 10:
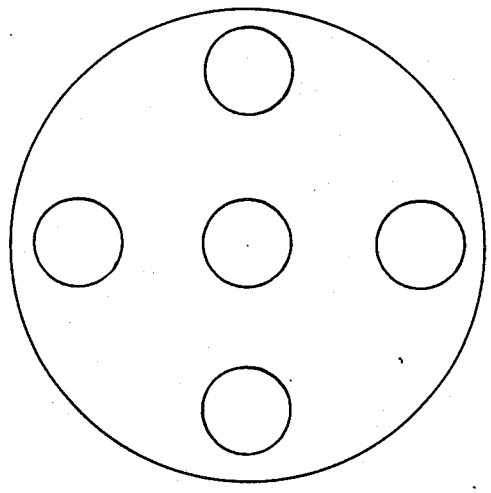

For increased production, the double ring process leads to convenient groupings of a large number of rods without greatly expanding the size of the reactor. Thus, FIG. 7 shows an inner ring of four deposition rods 70 and an outer ring of eight rods 71 for the total of fourteen while an even larger number, twenty, is shown in FIG. 8. Therein, the inner ring has eight rods 80 and the outer ring has twelve rods 81. FIG. 9 and FIG. 10 show other arrangements for smaller groupings. While the invention has been described by way of the preferred embodiment thereof, it will be appreciated that certain modifications may be made therein without departing from the spirit and scope of the invention.

What is claimed is:

1. In a process of producing polycrystalline or monocrystalline silicon by thermal decomposition and deposition of a silicon-containing composition upon a plurality of deposition members within a reactor chamber, the improvement which comprises the step of mounting the deposition members in an outer ring 50 and an inner ring surrounded by the outer ring that the deposition members of the outer ring are positioned so as to intercept and absorb the outward radiation from the inner ring in order to cause the outer ring deposition members to act as an insulative barrier to the heat from the inner ring's radiation and thus to prevent loss of a substantial amount of heat radiated by the inner ring deposition members.

2. A process as recited in claim 1 wherein the deposition members are provided in pairs and the outer ring has at least one more pair than the inner ring.

3. A process as recited in claim 2 wherein the inner ring is provided with two pairs deposition members.

4. A process as recited in claim 1 wherein the inner ring has more than two pairs deposition members.

5. A process as recited in claim 1 wherein said deposition members are tungsten or tantalum.

6. A process as recited in claim 1 wherein said deposition members are silicon.

7. A process as recited in claim 1 wherein the composition is selected from the group consisting of silicon tetrachloride, dichlorosilane, trichlorosilane, and mixtures thereof in a carrier gas.

* * * * *